(12) United States Patent
Lien

(10) Patent No.: US 9,160,360 B1
(45) Date of Patent: Oct. 13, 2015

(54) MULTIPLYING DIGITAL-TO-ANALOG CONVERTER AND PIPELINE ANALOG-TO-DIGITAL CONVERTER USING THE SAME

(71) Applicant: MediaTek Inc., Hsin-Chu (TW)

(72) Inventor: Yuan-Ching Lien, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/508,208

(22) Filed: Oct. 7, 2014

Related U.S. Application Data

(60) Provisional application No. 61/971,043, filed on Mar. 27, 2014.

(51) Int. Cl.
| | |
|---|---|
| *H03M 1/06* | (2006.01) |
| *H03M 1/44* | (2006.01) |
| *H03M 1/00* | (2006.01) |
| *H03M 1/12* | (2006.01) |

(52) U.S. Cl.
CPC ............ *H03M 1/442* (2013.01); *H03M 1/0697* (2013.01); *H03M 1/00* (2013.01); *H03M 1/12* (2013.01)

(58) Field of Classification Search
CPC ........ H03M 1/00; H03M 1/12; H03M 1/0695
USPC .......................... 341/118, 120, 161, 155, 156
See application file for complete search history.

(56) References Cited

U.S. PATENT DOCUMENTS 7,304,598 B1 * 12/2007 Bogner et al. ................ 341/161

8,659,461 B1    2/2014 Zhu et al.

OTHER PUBLICATIONS

Zhu, Y., et al.; "A 35 fJ 10b 160 MS/s Pipelined-SAR ADC with Decoupled Flip-Around MDAC and Self-Embedded Offset Cancellation;" IEEE Asian Solid-State Circuits Conference; Nov. 2011; pp. 61-64.
Zhu, Y., et al.; "A 50-fJ 10-b 160-MS/s Pipelined-SAR ADC Decoupled Flip-Around MDAC and Self-Embedded Offset Cancellation;" IEEE Journal of Solid-State Circuits; vol. 47; No. 11; Nov. 2012; pp. 2614-2626.
Razavi, B.; "Introduction to Swtiched-Capacitor Circuits;" pp. 395-438, chapt. 12 of "Design of Analog CMOS Integrated Circuits" (2000).
"Metastability in electronics;" Wikipedia; pp. 1-4.

* cited by examiner

*Primary Examiner* — Joseph Lauture
(74) *Attorney, Agent, or Firm* — McClure, Qualey & Rodack, LLP

(57) ABSTRACT

A multiplying digital-to-analog converter (MDAC) with capacitive load reset on an operational amplifier and a pipeline analog-to-digital converter using the MDAC are disclosed. The MDAC includes an operational amplifier and first and second switched-capacitor networks sharing the operational amplifier. The operational amplifier is further coupled with first capacitive load cells when the first switched-capacitor network is coupled to the operational amplifier, and the first capacitive load cells are reset when the first switched-capacitor network is disconnected from the operational amplifier. The operational amplifier is further coupled with second capacitive load cells when the second switched-capacitor network is coupled to the operational amplifier, and the second capacitive load cells are reset when the second switched-capacitor network is disconnected from the operational amplifier.

13 Claims, 4 Drawing Sheets

MULTIPLYING DIGITAL-TO-ANALOG CONVERTER AND PIPELINE ANALOG-TO-DIGITAL CONVERTER USING THE SAME

CROSS REFERENCE TO RELATED APPLICATIONS

This application claims the benefit of U.S. Provisional Application No. 61/971,043 filed Mar. 27, 2014, the entirety of which is incorporated by reference herein.

BACKGROUND OF THE INVENTION

1. Field of the Invention

The present invention relates to a multiplying digital-to-analog converter (MDAC) with capacitive load reset on an operational amplifier and a pipeline analog-to-digital converter (pipeline ADC) using the MDAC.

2. Description of the Related Art

Pipeline ADC has become a popular ADC architecture, which is used in a wide range of applications, including CCD imaging, ultrasonic medical imaging, digital receivers, base stations, digital video (for example, HDTV), xDSL, cable modems, fast Ethernet, and so on.

A pipeline ADC generally includes operational amplifiers (op amps) and the settling time of the pipeline ADC depends on the design of the op amps. A pipeline ADC with a fast settling time is called for.

BRIEF SUMMARY OF THE INVENTION

A multiplying digital-to-analog converter (MDAC) and a pipeline analog-to-digital converter (pipeline ADC) using the MDAC are disclosed.

An MDAC in accordance with an exemplary embodiment of the disclosure includes an operational amplifier, a first switched-capacitor network and a second switched capacitor network. The MDAC generates an analog output in accordance with digital input bits. The first switched-capacitor network and a second switched capacitor network share the operational amplifier. The first switched-capacitor network samples an analog signal when the first switched-capacitor network is disconnected from the operational amplifier. The first switched-capacitor network is coupled to the operational amplifier for sampled signal amplification based on the digital input bits when the second switched-capacitor network is disconnected from the operational amplifier. The second switched-capacitor network samples the analog signal when the second switched-capacitor network is disconnected from the operational amplifier. The second switched-capacitor network is coupled to the operational amplifier for sampled signal amplification based on the digital input bits when the first switched-capacitor network is disconnected from the operational amplifier. The operational amplifier is further coupled with first capacitive load cells when the first switched-capacitor network is coupled to the operational amplifier, and the first capacitive load cells are reset when the first switched-capacitor network is disconnected from the operational amplifier. The operational amplifier is further coupled with second capacitive load cells when the second switched-capacitor network is coupled to the operational amplifier, and the second capacitive load cells are reset when the second switched-capacitor network is disconnected from the operational amplifier.

In another exemplary embodiment, a pipeline ADC is shown. In addition to the aforementioned MDAC, the pipeline ADC further includes first and second analog-to-digital converters (ADCs) and a processing unit. The processing unit is for time alignment and digital error correction. The MDAC is coupled to an analog input of the pipeline ADC to receive the analog signal that is sampled by the first or second switched-capacitor networks. Furthermore, the analog signal is further provided to the first ADC to generate the digital input bits for the MDAC. The analog output of the MDAC is coupled to the second ADC and the second ADC outputs a digital representation of a signal received by the second ADC. The processing unit receives the digital input bits generated by the first ADC and the digital representation generated by the second ADC for generation of a digital output of the pipeline ADC.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
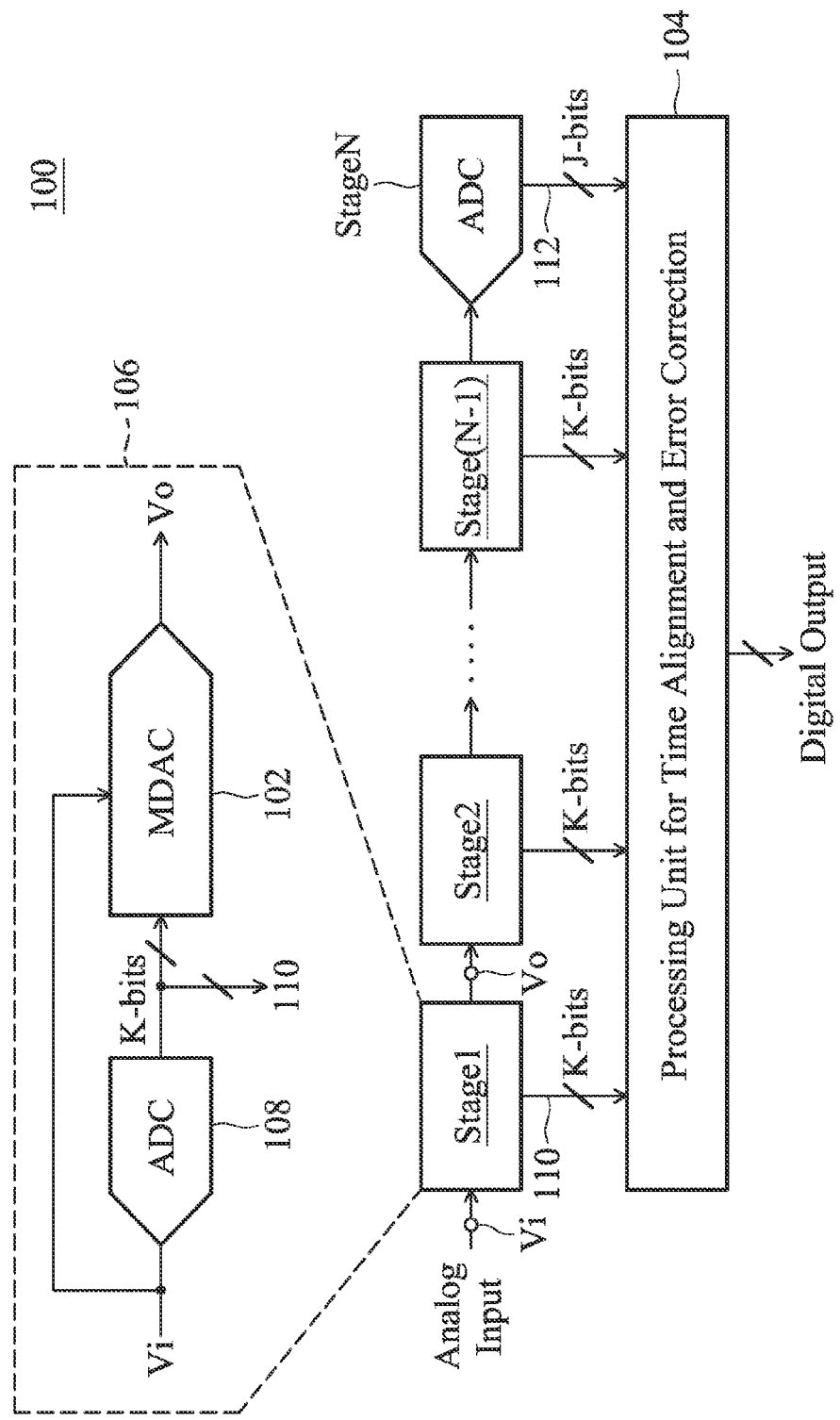
FIG. 1 illustrates a pipeline ADC 100 using an MDAC 102 in accordance with an exemplary embodiment of the disclosure.

FIG. 1 illustrates a pipeline ADC 100 using an MDAC 102 in accordance with an exemplary embodiment of the disclosure. The pipeline ADC 100 includes N stages numbered from Stage1 to StageN and a processing unit 104. The last stage StageN is an analog-to-digital converter (ADC), e.g. a direct conversion ADC or a successive approximation register ADC (abbreviated to SAR ADC). A proposed circuit, e.g. circuit 106, for any of the stages Stage1 to Stage(N−1) is shown and discussed in the following paragraphs, which includes an ADC 108 as well as the MDAC 102.

As shown, an analog input of the pipeline ADC 100 is coupled to the circuit 106 in the first stage Stage1 as an analog signal Vi. The ADC 108 performs an analog-to-digital conversion on the analog signal Vi and generates digital input bits 110 (e.g. K-bits) for the MDAC 102. The MDAC 102 receives the digital input bits 110 and the analog signal Vi and generates an analog output Vo for the next stage Stage2. The digital input bits 110 are further received by the processing unit 104. Similar to the circuit 106, stages Stage2 to Stage(N−1) are provided and cascaded after the first stage Stage1, each providing K-bits to the processing unit 104. The last stage StageN, an ADC, converts the analog output of the previous stage Stage(N−1) to a digital representation 112 (e.g. J-bits). In accordance with the digital bits received from the stages Stage1 to StageN, the processing unit 104 for time alignment and error correction generates the digital output of the pipeline ADC 100.

Note that the MDAC 102 is in an opamp-sharing architecture. There is one operational amplifier in the MDAC 102 and the operational amplifier is shared by several signal processing channels. When one channel is using the operational amplifier, a capacitive-load reset operation is performed for another channel that is disconnected from the operation amplifier. In this manner, the settling time of the pipeline ADC 100 is effectively reduced without sacrificing the normal operation phases of the pipeline ADC 100.

Figure 2:
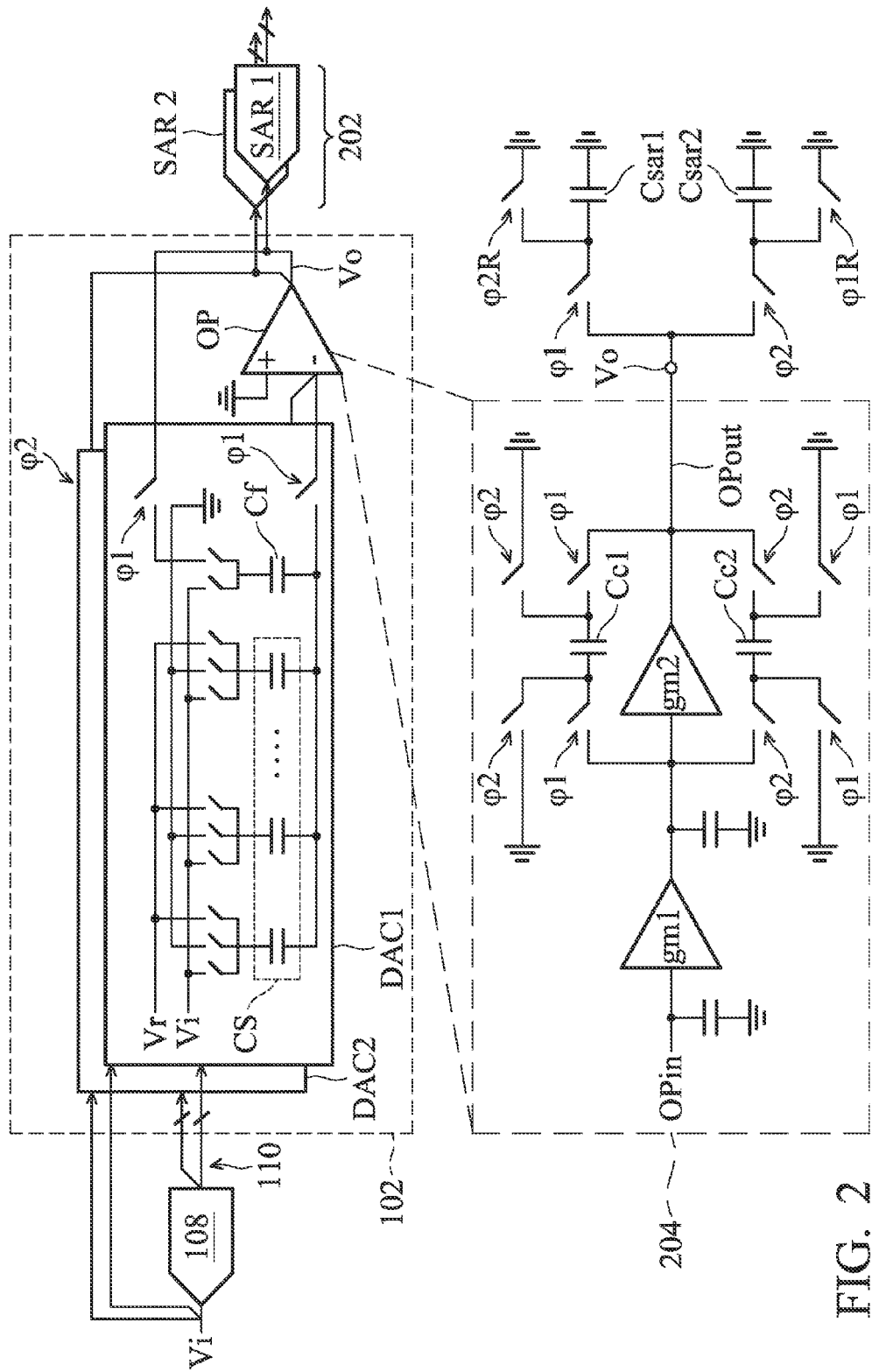
FIG. 2 illustrates the MDAC 102 in detail in accordance with an exemplary embodiment of the disclosure.

FIG. 2 illustrates the MDAC 102 in detail in accordance with an exemplary embodiment of the disclosure, which is in the stage followed by an ADC 202 (e.g. the ADC in StageN of FIG. 1). As shown in FIG. 2, the MDAC 102 includes an operational amplifier OP and switched-capacitor networks DAC1 and DAC2 sharing the operational amplifier OP. The switched-capacitor networks DAC1 and DAC2 correspond to two different signal processing channels, respectively. The ADC 202 may be implemented by two time-interleaved SAR ADCs SAR1 and SAR2 corresponding to the two channels, respectively.

The signal processing of channel 1 is discussed in this paragraph. In a sampling phase for channel 1 (control signal $\phi 1$ off), the switched-capacitor network DAC1 is disconnected from the operational amplifier OP and the analog signal Vi is sampled by the capacitors CS and Cf of the switched-capacitor network DAC1. In an amplification phase for channel 1 (control signal $\phi 1$ on), the switched-capacitor network DAC1 is coupled to the operational amplifier OP for sampled signal amplification based on the digital input bits 110 provided from the ADC 108. For signal amplification, the feedback capacitor Cf of DAC1 is coupled between the input and output terminals of the operational amplifier OP and the remaining capacitors Cs of DAC1 are controlled by the digital input bits 110, respectively, to connect the input terminal of the operational amplifier OP to ground or a reference voltage source Vr. When the switched-capacitor network DAC1 is coupled to the operation amplifier OP, the analog output Vo of the MDAC 102 is sampled into the sampling capacitor cells of the SAR ADC SAR1. When the switched-capacitor network DAC1 is disconnected from the operation amplifier OP, the SAR ADC SAR1 determines a digital representation of the sampled analog output in successive approximations.

The signal processing of channel 2 is discussed in this paragraph. In a sampling phase for channel 2 (control signal $\phi 2$ off), the switched-capacitor network DAC2 is disconnected from the operational amplifier OP and the analog signal Vi is sampled by the capacitors CS and Cf of the switched-capacitor network DAC2. In an amplification phase for channel 2 (control signal $\phi 2$ on), the switched-capacitor network DAC2 is coupled to the operational amplifier OP for sampled signal amplification based on the digital input bits 110 provided from the ADC 108. For signal amplification, the feedback capacitor Cf of DAC2 is coupled between the input and output terminals of the operational amplifier OP and the remaining capacitors Cs of DAC2 are controlled by the digital input bits 110, respectively, to connect the input terminal of the operational amplifier OP to ground or a reference voltage source Vr. When the switched-capacitor network DAC2 is coupled to the operation amplifier OP, the analog output Vo of the MDAC 102 is sampled into the sampling capacitor cells of the SAR ADC SAR2. When the switched-capacitor network DAC2 is disconnected from the operation amplifier OP, the SAR ADC SAR2 determines a digital representation of the sampled analog output in successive approximations.

As described above, the operational amplifier OP is shared by the two signal processing channels. In an exemplary embodiment, the control signals $\phi 1$ and $\phi 2$ are in opposite phases. The switched-capacitor network DAC1 is disconnected from the operational amplifier OP for the sampling phase (control signal $\phi 1$ off) when the switched-capacitor network DAC2 is coupled to the operational amplifier OP for the amplification phase (control signal $\phi 2$ on). The switched-capacitor network DAC1 is coupled to the operational amplifier OP for the amplification phase (control signal $\phi 1$ on) when the switched-capacitor network DAC2 is disconnected from the operational amplifier OP for the sampling phase (control signal $\phi 2$ off).

A proposed architecture 204 of the operational amplifier OP and the sampling capacitor cells Csar1 of the SAR ADC (SAR1) and the sampling capacitor cells Csar2 of the SAR ADC (SAR2) are also shown in FIG. 2. Referring to the proposed architecture 204, the operational amplifier OP amplifies an input signal OPin by two gain stages gm1 and gm2 and generates an output signal OPout as the analog output Vo of the MDAC 102. Furthermore, compensation capacitor cells Cc1 for loop compensation of the signal processing loop formed by the switched-capacitor network DAC1 and the operational amplifier OP and compensation capacitor cells Cc2 for loop compensation of the signal processing loop formed by the switched-capacitor network DAC2 and the operational amplifier OP are provided. The sampling capacitor cells Csar1 and/or the compensation capacitor cells Cc1 are/is regarded as capacitive load cells of channel 1. The sampling capacitor cells Csar2 and/or the compensation capacitor cells Cc2 are/is regarded as capacitive load cells of channel 2.

The compensation capacitor cells Cc1 for channel 1 and the compensation capacitor cells Cc2 for channel 2 are discussed in this paragraph and are operated according to the control signals $\phi 1$ and $\phi 2$. As shown, the compensation capacitor cells Cc1 are coupled in parallel between the input and output terminals of the second gain stage gm2 for loop compensation when operational amplifier OP is coupled to the switched-capacitor network DAC1 for the amplification phase of channel 1, and the compensation capacitor cells Cc1 are reset when the operational amplifier OP is disconnected from the switched-capacitor network DAC1 and removed from the signal processing path of channel 1. In this manner, the compensation capacitor cells Cc1 are reset without sacrificing the normal operation phases of channel 1. Furthermore, the compensation capacitor cells Cc2 are coupled in parallel between the input and output terminals of the second gain stage gm2 for loop compensation when operational amplifier OP is coupled to the switched-capacitor network DAC2 for the amplification phase of channel 2, and the compensation capacitor cells Cc2 are reset when the operational amplifier OP is disconnected from the switched-capacitor network DAC2 and removed from the signal processing path of channel 2. In this manner, the compensation capacitor cells Cc2 are reset without sacrificing the normal operation phases of channel 2. The aforementioned capacitive load reset operation results in a fast settling time of the entire pipeline ADC 100 of FIG. 1.

The sampling capacitor cells Csar1 of SAR1 and the sampling capacitor cells Csar2 of SAR2 are discussed in this paragraph and are operated according to the control signals $\phi 1$, $\phi 2$, $\phi 1R$ and $\phi 2R$. The sampling capacitor cells Csar1 of SAR1 are coupled to the operational amplifier OP to sample the analog output Vo of the MDAC 102 when the switched-capacitor network DAC1 is coupled to the operational amplifier OP. According to the control signal $\phi 2R$, the sampling capacitor cells Csar1 of SAR1 are reset after the successive approximation cycles of the SAR ADC SAR1 and, at that moment, the operational amplifier OP is disconnected from the switched-capacitor network DAC1 and the sampling capacitor cells Csar1 of SAR1 are disconnected from the operation amplifier OP. In this manner, the sampling capacitor cells Csar1 are reset without sacrificing the normal operation phases of the SAR ADC SAR1. The sampling capacitor cells Csar2 of SAR2 are coupled to the operational amplifier OP to sample the analog output Vo of the MDAC 102 when the switched-capacitor network DAC2 is coupled to the operational amplifier OP. According to the control signal φ1R, the sampling capacitor cells Csar2 of SAR2 are reset after the successive approximation cycles of the SAR ADC SAR2 and, at that moment, the operational amplifier OP is disconnected from the switched-capacitor network DAC2 and the sampling capacitor cells Csar2 of SAR2 are disconnected from the operation amplifier OP. In this manner, the sampling capacitor cells Csar2 are reset without sacrificing the normal operation phases of the SAR ADC SAR2. The aforementioned capacitive load reset operation results in a fast settling time of the entire pipeline ADC 100 of FIG. 1.

In FIG. 2, the capacitive load cells (e.g., Cc1, Cc2, Csar1 or Csar2) are reset by connecting all top plates and bottom plates to a common mode voltage level (e.g., a ground level). In another exemplary embodiment, the MDAC 102 is in a differential architecture and the capacitive load cells (e.g., Cc1, Cc2, Csar1 or Csar2) may be reset by connecting the positive capacitor cells (provided from the capacitive load cells for the positive signal path) with the negative capacitor cells (provided from the capacitive load cells for the negative signal path) for charge neutralization.

Note that the switched-capacitor network architecture (containing capacitors Cs and Cf and operated by a reference voltage source Vr) shown in FIG. 2 is not intended to limit the structure of the switched-capacitor networks. The switched-capacitor network architecture shown in FIG. 2 may be replaced by another switched-capacitor network circuit.

Furthermore, it is not intended to limit the operational amplifier OP to the 2-stage architecture 204 and any capacitive device coupled to the operational amplifier OP as a capacitive loading may be reset by the aforementioned technique.

Figure 3:
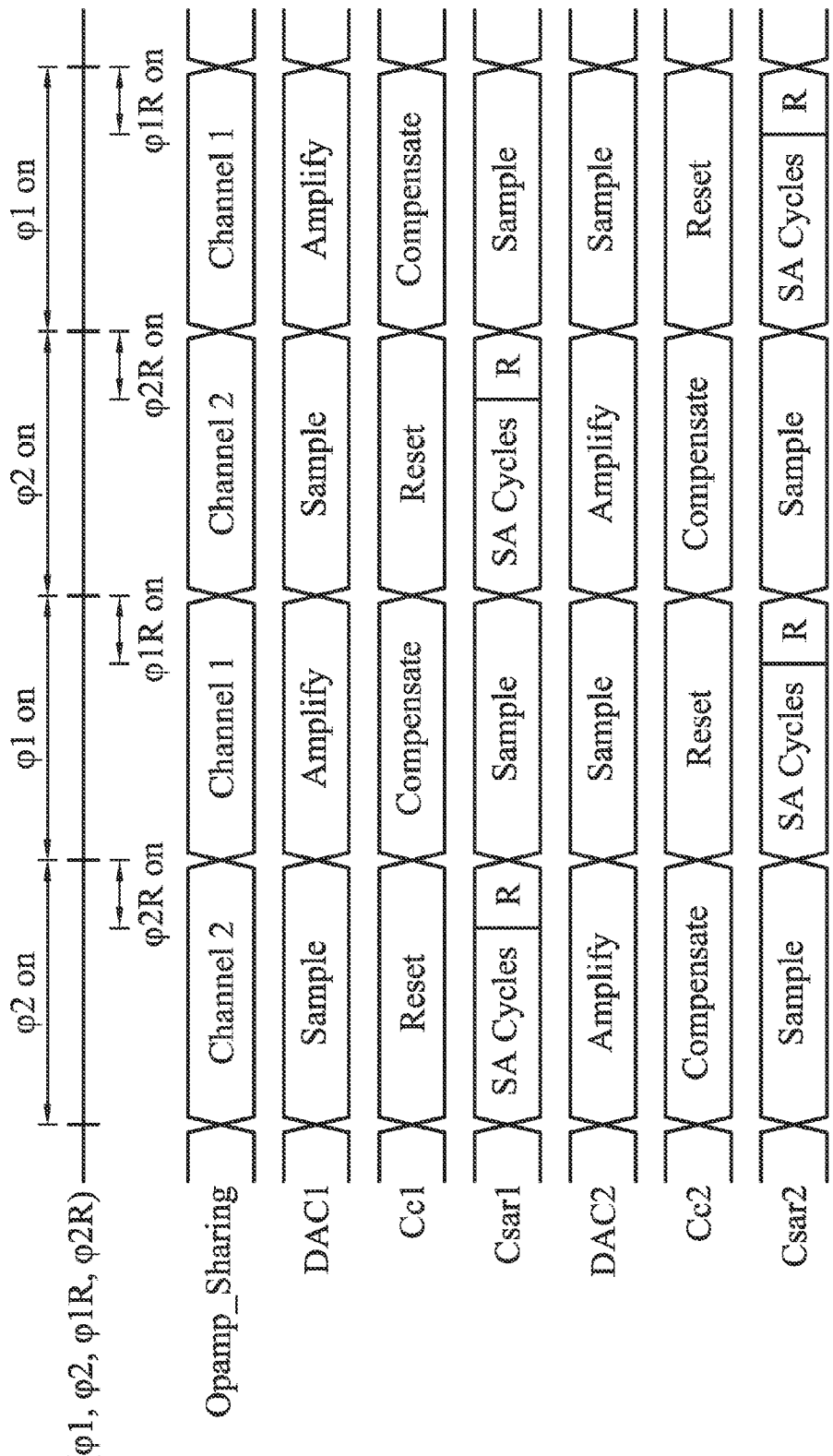
FIG. 3 shows waveforms for operating the opamp-sharing architecture of FIG. 2.

FIG. 3 shows waveforms for operating the op-sharing architecture of FIG. 2. The compensation capacitor cells Cc1 and the sampling capacitor cells Csar1 specially designed for channel 1 are reset when the operational amplifier OP is switched to the signal amplification of channel 2, without sacrificing the normal operation phases of channel 1. The compensation capacitor cells Cc2 and the sampling capacitor cells Csar2 specially designed for channel 2 are reset when the operational amplifier OP is switched to the signal amplification of channel 1, without sacrificing the normal operation phases of channel 2. Note that the sampling capacitor cells Csar1 are reset after the successive approximations provided for the analog output Vo sampled in the sampling capacitor cells Csar1, and the sampling capacitor cells Csar2 are reset after the successive approximations provided for the analog output Vo sampled in the sampling capacitor cells Csar2.

Figure 4:
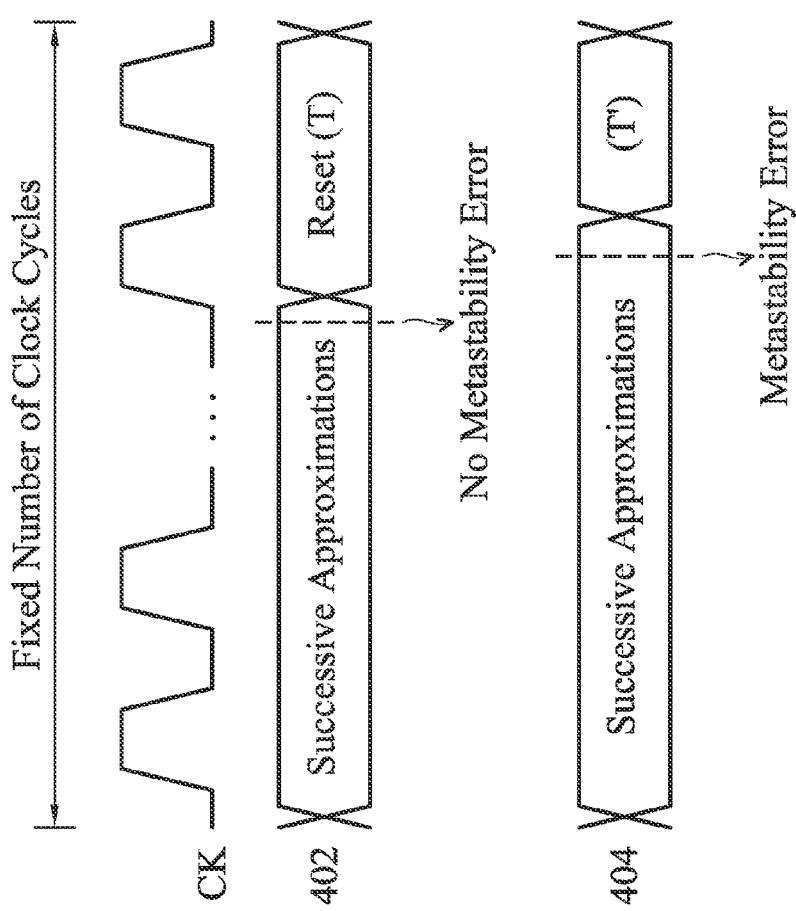
FIG. 4 depicts an adjustment technique for the reset duration of the sampling capacitor cells Csar1 of SAR1 (or Csar2 of SAR2) in accordance with an exemplary embodiment of the disclosure.

FIG. 4 depicts an adjustment technique for the reset duration of the sampling capacitor cells Csar1 of SAR1 and Csar2 of SAR2 in accordance with an exemplary embodiment of the disclosure. Signal CK is a clock signal. In a case wherein the SAR ADC SAR1/SAR2 is in an asynchronous architecture, the signal CK is the asynchronous ADC clock generated by the asynchronous SAR ADC itself. Each SAR ADC conversion is provided with a fixed number of clock cycles. The reset duration for sampling capacitor cells of an SAR ADC depends on the metastability of successive approximations provided for a signal sampled in the sampling capacitor cells. Referring to waveform 402, when a digital representation of a signal sampled in the sampling capacitor cells is obtained during a proper number of successive approximation cycles, no metastability error occurs and therefore the sampling capacitor cells are reset for a pre-determined reset duration T. Referring to waveform 404, when a metastability error occurs to indicate that more conversion time are required for a fixed number of clock cycles, the reset duration for the sampling capacitor cells are reduced to T' or even zero.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multiplying digital-to-analog converter, generating an analog output in accordance with digital input bits, comprising:
   an operational amplifier; and
   a first switched-capacitor network and a second switched capacitor network sharing the operational amplifier,
   wherein:
   the first switched-capacitor network samples an analog signal when the first switched-capacitor network is disconnected from the operational amplifier;
   the first switched-capacitor network is coupled to the operational amplifier for sampled signal amplification based on the digital input bits when the second switched-capacitor network is disconnected from the operational amplifier;
   the second switched-capacitor network samples the analog signal when the second switched-capacitor network is disconnected from the operational amplifier;
   the second switched-capacitor network is coupled to the operational amplifier for sampled signal amplification based on the digital input bits when the first switched-capacitor network is disconnected from the operational amplifier;
   the operational amplifier is further coupled with first capacitive load cells when the first switched-capacitor network is coupled to the operational amplifier, and the first capacitive load cells are reset when the first switched-capacitor network is disconnected from the operational amplifier; and
   the operational amplifier is further coupled with second capacitive load cells when the second switched-capacitor network is coupled to the operational amplifier, and the second capacitive load cells are reset when the second switched-capacitor network is disconnected from the operational amplifier.

2. The multiplying digital-to-analog converter as claimed in claim 1, wherein:
   the first capacitive load cells are provided for the first switched-capacitor network and the operational amplifier for loop compensation; and
   the second capacitive load cells are provided for the second switched-capacitor network and the operational amplifier for loop compensation.

3. The multiplying digital-to-analog converter as claimed in claim 2, wherein:

the first capacitive load cells are reset by connecting top plates and bottom plates of the first capacitive load cells to a common mode voltage level; and the second capacitive load cells are reset by connecting top plates and bottom plates of the second capacitive load cells to a common mode voltage level.

4. The multiplying digital-to-analog converter as claimed in claim 2, wherein:

the multiplying digital-to-analog converter is in a differential architecture;

the first capacitive load cells are reset by connecting positive capacitor cells between the first capacitive load cells with negative capacitor cells between the first capacitive load cells for charge neutralization; and the second capacitive load cells are reset by connecting positive capacitor cells between the second capacitive load cells with negative capacitor cells between the second capacitive load cells for charge neutralization.

5. The multiplying digital-to-analog converter as claimed in claim 1, wherein:

the analog output of the multiplying digital-to-analog converter is further coupled to an analog-to-digital converter comprising a first successive approximation register analog-to-digital converter and a second successive approximation register analog-to-digital converter;

the first capacitive load cells are provided by the first successive approximation register analog-to-digital converter, which sample the analog output of the multiplying digital-to-analog converter when the first switched-capacitor network is coupled to the operational amplifier; and the second capacitive load cells are provided by the second successive approximation register analog-to-digital converter, which sample the analog output of the multiplying digital-to-analog converter when the second switched-capacitor network is coupled to the operational amplifier.

6. The multiplying digital-to-analog converter as claimed in claim 5, wherein:

when the first switched-capacitor network is disconnected from the operational amplifier, the first successive approximation register analog-to-digital converter determines a digital representation of the analog output sampled in the first capacitive load cells in successive approximations; and when the second switched-capacitor network is disconnected from the operational amplifier, the second successive approximation register analog-to-digital converter determines a digital representation of the analog output sampled in the second capacitive load cells in successive approximations.

7. The multiplying digital-to-analog converter as claimed in claim 6, wherein:

the first capacitive load cells are reset after successive approximations provided for the analog output sampled in the first capacitive load cells; and the second capacitive load cells are reset after successive approximations provided for the analog output sampled in the second capacitive load cells.

8. The multiplying digital-to-analog converter as claimed in claim 7, wherein:

a reset duration for the first capacitive load cells depends on metastability of the successive approximations provided for the analog output sampled in the first capacitive load cells; and a reset duration for the second capacitive load cells depends on metastability of the successive approximations provided for the analog output sampled in the second capacitive load cells.

9. The multiplying digital-to-analog converter as claimed in claim 8, wherein:

the reset duration for the first capacitive load cells is reduced when a metastability error occurs to indicate that more cycles are required for the successive approximations provided for the analog output sampled in the first capacitive load cells; and the reset duration for the second capacitive load cells is reduced to zero when a metastability error occurs to indicate that more cycles are required for the successive approximations provided for the analog output sampled in the second capacitive load cells.

10. The multiplying digital-to-analog converter as claimed in claim 5, wherein:

the first capacitive load cells are reset by connecting top plates and bottom plates of the first capacitive load cells to a common mode voltage level; and the second capacitive load cells are reset by connecting top plates and bottom plates of the second capacitive load cells to a common mode voltage level.

11. The multiplying digital-to-analog converter as claimed in claim 5, wherein:

the multiplying digital-to-analog converter is in a differential architecture;

the first capacitive load cells are reset by connecting positive capacitor cells between the first capacitive load cells with negative capacitor cells between the first capacitive load cells for charge neutralization; and the second capacitive load cells are reset by connecting positive capacitor cells between the second capacitive load cells with negative capacitor cells between the second capacitive load cells for charge neutralization.

12. The multiplying digital-to-analog converter as claimed in claim 1, wherein:

the first switched-capacitor network samples the analog signal when the second switched-capacitor network is coupled to the operational amplifier for sampled signal amplification based on the digital input bits; and the second switched-capacitor network samples the analog signal when the first switched-capacitor network is coupled to the operational amplifier for sampled signal amplification based on the digital input bits.

13. A pipeline analog-to-digital converter, comprising:

the multiplying digital-to-analog converter as claimed in claim 1 and coupled to an analog input of the pipeline analog-to-digital converter to receive the analog signal;

a first analog-to-digital converter that provides the multiplying digital-to-analog converter with the digital input bits based on the analog signal;

a second analog-to-digital converter, coupled to the analog output of the multiplying digital-to-analog converter for generation of a digital representation; and a processing unit for time alignment and digital error correction, receiving the digital input bits generated by the first analog-to-digital converter and the digital representation generated by the second analog-to-digital converter for generation of a digital output of the pipeline analog-to-digital converter.

* * * * *